United States Patent [19]
Wei et al.

[11] Patent Number: 6,083,341
[45] Date of Patent: Jul. 4, 2000

[54] METHOD FOR MAKING COATINGS OF UNIFORM THICKNESS

[75] Inventors: Chang Wei; George Theodore Dalakos, both of Niskayuna, N.Y.

[73] Assignee: Lockheed Martin Corp., Marietta, Ga.

[21] Appl. No.: 09/172,502

[22] Filed: Oct. 14, 1998

[51] Int. Cl.$^7$ .............. H05H 1/24; B05D 5/06; B32B 31/14
[52] U.S. Cl. .............. 156/274.4; 427/569; 427/578; 427/166; 427/167
[58] Field of Search .............. 156/272.2, 274.4, 156/274.8, 273.1, 273.9, 306.3, 379.7, 380.2, 380.3, 380.6, 272.6, 278; 427/569, 570, 574, 578, 580, 162, 166, 167

[56] References Cited

U.S. PATENT DOCUMENTS 5,009,920  4/1991  Lee .............. 427/9
6,010,756  1/2000  Gasworth .............. 427/576

*Primary Examiner*—Michael W. Ball
*Assistant Examiner*—John T Haran
*Attorney, Agent, or Firm*—W. H. Meise; E. R. Katz

[57] ABSTRACT

A method for forming coatings of constant thickness on sheets of dielectric substrate (10), which may be curved, includes the step of adhesively applying foil (12) to one side of the dielectric substrate. An electrode (16) is set at a constant distance (D) from the side (10fs) of the substrate to be coated. If the substrate is curved, the electrode is preferably also curved. The region to be coated is evacuated, gaseous precursor materials are infused into the gap, and voltage is applied between the foil (12) and the electrode (16) sufficient to ionize the precursors to a plasma state, whereupon the deposition occurs. The foil may be applied as an adhesive-backed foil. The adhesive may be electrically conductive.

10 Claims, 3 Drawing Sheets

METHOD FOR MAKING COATINGS OF UNIFORM THICKNESS

FIELD OF THE INVENTION

This invention relates to coatings, and more particularly to optical coatings on surfaces of dielectric substrates, and especially curved dielectric substrates.

BACKGROUND OF THE INVENTION

Rugate filters are interference filters which block transmission of light at selected wavelengths, and can be used for many purposes. Among the various uses are glasses, for example, for protection against laser light. In some cases, the rugate filter may have to be applied to a curved transparent surface, as for example the curved surface of a pair of glasses. Functional effectiveness requires that the coating or coatings which make up a rugate filter have thickness which is uniform, in a three-dimensional sense, across the optical aperture being protected. That is, the thickness of the rugate filter coating(s) must be uniform at each and every point over the three-dimensional surface of the lens or glass.

A common method for application of rugate filter coatings is plasma-enhanced chemical vapor deposition (PECVD). A problem with the fabrication of rugate filter coatings on curved dielectric surfaces is that the electric fields which generate the plasma for enhancement tend to be distributed in a nonuniform manner across the surface being coated, which in turn tends to adversely affect the coating uniformity.

Improved coating methods are desired.

SUMMARY OF THE INVENTION

A method according to an aspect of the invention, for applying a coating to a first surface of a sheet dielectric substrate, includes the step of adhesively applying a layer of electrically conductive foil to a second surface of the sheet dielectric substrate. An electrode is placed at a distance from the first surface of the sheet dielectric substrate, to thereby define a gap.

In a preferred mode of the method, the distance is constant, as measured at various locations over the surfaces. At least the region lying between the electrode and the first surface of the sheet dielectric substrate is evacuated. Coating precursor materials are infused into the gap, and then voltage is applied between the electrode and the conductive foil, to thereby ionize the precursor materials into a plasma state. The coating is, as a result, deposited the first surface of the sheet dielectric material. In a particularly advantageous mode of performing the method of the invention, the step of adhesively applying includes the step of applying adhesive-backed foil to the second surface of the sheet dielectric material. In those cases in which the width of the adhesive-backed foil is not as wide as the second surface of the sheet dielectric material, and the region about the second surface of the substrate is evacuated, the step of adhesively applying further includes the steps of placing overlapping strips of the adhesive-backed foil on the second surface, and firmly pressing the adhesive-backed foil strips to the second surface of the sheet dielectric material, to thereby eliminate voids in the region of the overlap. The preferred method for infusing the gaseous coating precursor materials into the gap is through perforations in the electrode.

In a particularly advantageous manifestation of the method, rugate filters are deposited on a first surface of transparent curved sheet dielectric substrate, such as curved windows or windshields, by adhesively applying a layer of electrically conductive foil to a second surface of the sheet dielectric substrate. An electrode which is curved to match the curvature of the substrate is placed at a constant distance from the first surface of the sheet dielectric substrate, to thereby define a gap. At least the region lying between the electrode and the first surface of the sheet dielectric substrate is evacuated, and the entire sheet dielectric substrate may be placed in an evacuated chamber. At least first and second gaseous coating precursor materials at a particular ratio are infused into the gap. Voltage is applied between the electrode and the conductive foil, to thereby ionize the precursor materials into a plasma state, whereby coating is deposited on the surface of the first side of the sheet dielectric material. The ratio of the precursor materials is changed as a function of at least one of time and the thickness of the coating.

DESCRIPTION OF THE INVENTION

Figure 1:
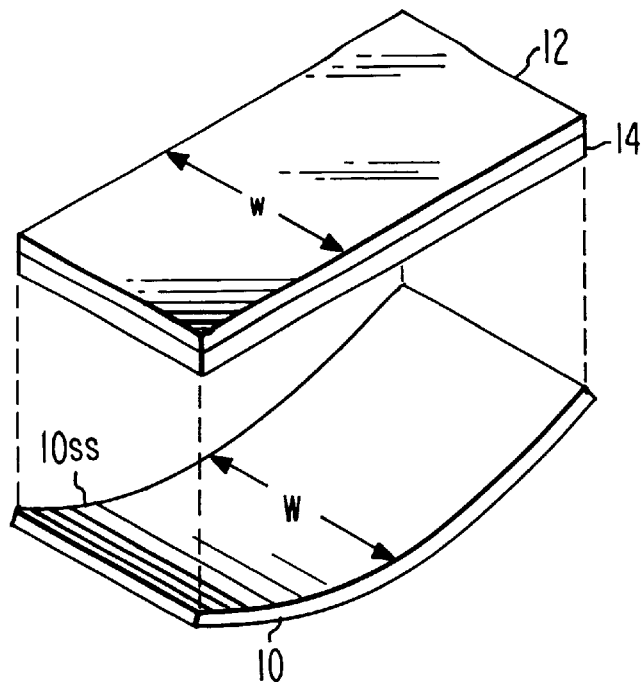
FIG. 1 is a simplified illustration, in perspective or isometric view, of a sheet dielectric substrate and adhesive-backed foil, ready for a step according to a method of the invention.

FIG. 1 is a simplified illustration, in perspective or isometric view, of a curved sheet dielectric substrate 10 and adhesive-backed foil, ready for a step according to a method of the invention. The adhesive-backed foil includes a layer of electrically conductive or metallic foil 12, with a layer 14 of adhesive of substantially constant thickness affixed to a side thereof. As illustrated in FIG. 1, the width of the adhesive-backed foil is w, and the width of the sheet dielectric substrate 10 is W. A preferred adhesive-backed foil is 1" wide, manufactured by Lamart Corporation, whose address is 16-T Richmond Street, Clifton, N.J. 07015.

Figure 2:
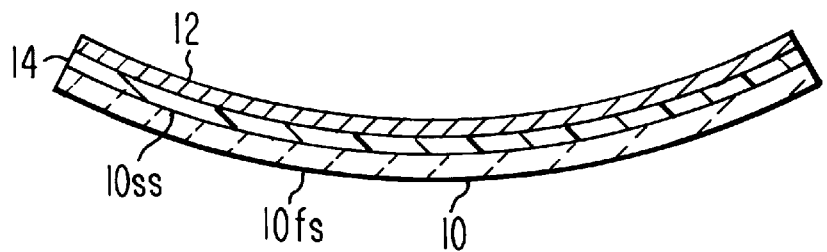
FIG. 2 is a cross-sectional view of an assemblage of the adhesive-backed foil of FIG. 1 applied to a second side of the sheet dielectric substrate.

FIG. 2 is a cross-sectional view of an assemblage of the adhesive-backed foil of FIG. 1 applied to a second side 10ss of the sheet dielectric substrate 10. Since the adhesive is of substantially constant thickness, the foil is spaced at a constant distance from the second surface 10ss of the sheet dielectric substrate 10, notwithstanding the curvature of the sheet dielectric substrate.

Figure 3:
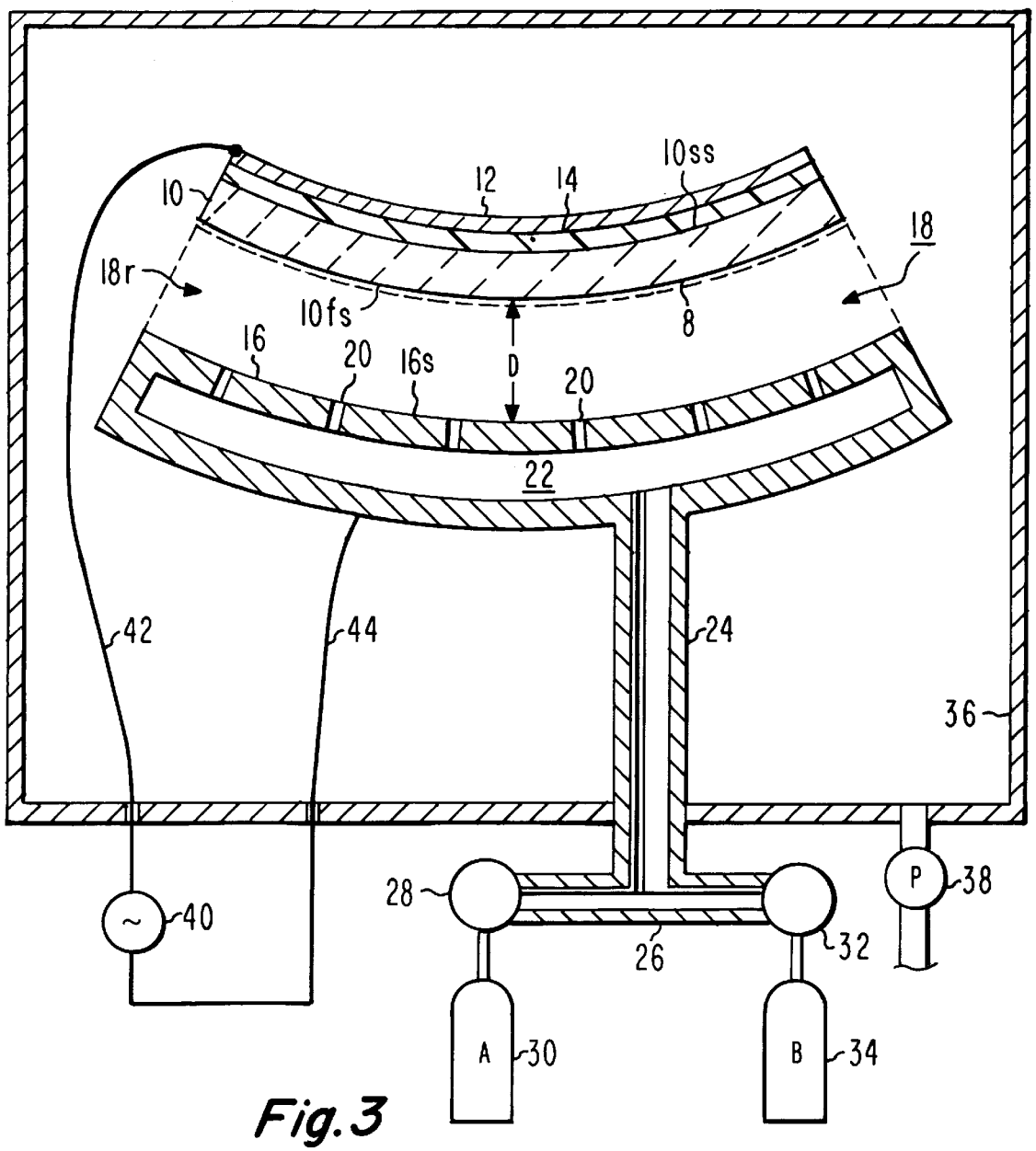
FIG. 3 illustrates the assemblage of FIG. 2 mounted in a vacuum chamber, with a further electrode, and ready for deposition or forming of the coating.

FIG. 3 illustrates the adhesive-backed foil/sheet dielectric substrate assemblage of FIG. 2 mounted (by mounting means, which are not illustrated) in a vacuum chamber 36, with a further electrode 16, and ready for deposition or forming of the coating. More particularly, the first side 10fs of the sheet dielectric substrate 10 faces a surface 16s of an electrically conductive electrode 16 across a gap 18. That surface 16s of electrode 16 which faces sheet dielectric substrate 10 is curved to match the curvature of surface 10fs, so the dimension D of the gap 18 is substantially constant across the entire width of the sheet dielectric substrate 10.

According to an aspect of the invention, an alternating voltage source, often an RF (radio frequency) source, illustrated by an alternating generator symbol 40, is connected by conductors or wires 42, 44 to the conductive foil 12 and the conductive electrode 16, so that an electric field is established across the electrodes. Because of the constant dimension D of gap 18, and the parallelism between the foil electrode 12 and the second surface 10ss of the sheet dielectric substrate 10, the electric field is normal or orthogonal to the first surface 10fs of the sheet dielectric substrate at all locations across the width of the sheet dielectric substrate 10. The plasma tends to be more uniformly distributed across the first surface 10fs of the sheet dielectric substrate by the more uniform bias attributable to the parallelism of between the foil electrode 12 and second surface 10ss. Put another way, there are no locations along the surface at which the field strength varies relative to other locations.

As also illustrated in FIG. 3, electrode 16 defines a manifold or plenum 22, which communicates with a plurality of apertures 20 extending through from the manifold 22 to surface 16s. A pipe or conduit 24 extends from manifold 22, through a side of vacuum chamber 36, and connects, by way of a tee junction 26, with controls 28, 32 of a pair of tanks 30, 34, respectively, which contain pressurized coating precursor materials, which are designated A and B for simplicity. In practice, multiple precursor materials are often used. For example, to deposit Rugate filters, three precursor materials, namely $SiH_4$, $N_2O$, and $NH_3$, are often used to form modulated $SiO_xN_y$ coating; the flow rates of the $N_2O$ and $NH_3$ are changed as a function of time while the flow rate of the $SiH_4$ is held constant. In addition, inert gases such as Ar or He, may be included for process optimization.

Those skilled in the art know that silicon dioxide ($SiO_2$) coatings may be made from precursors $N_2O$ and $SiH_4$, and that silicon nitride coatings ($Si_3N_4$) may be made from precursors $NH_3$ and $SiH_4$. In the method according to the invention, the precursor materials are allowed to enter the manifold 22 in the proper ratio, whereupon they infuse the gap 18. The RF voltage from source 40 is applied in a magnitude sufficient to ionize the precursor materials, or to form a plasma, in the region between electrode surface 16s and first surface 10fs of the sheet dielectric substrate 10. Deposition of the coating occurs onto first surface 10fs of sheet dielectric material 10. Under appropriate conditions of pressure, temperature, voltage, and the like, which are not part of the invention, the coating achieves the desired properties. Of course, increased time of exposure to the plasma increases the thickness of the coating.

Figure 4:
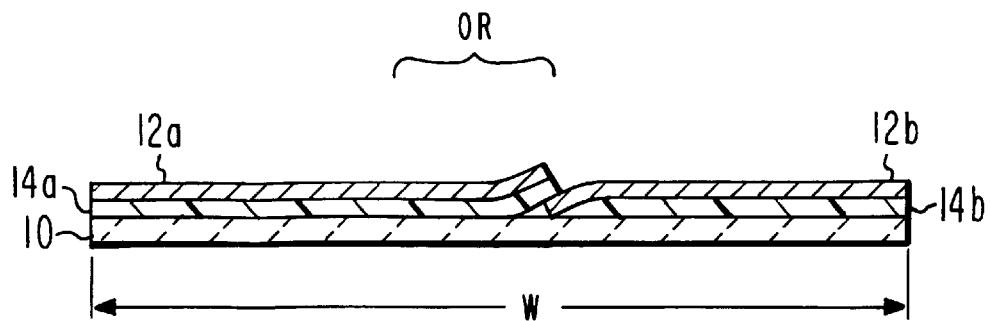
FIG. 4 illustrates a dielectric substrate with overlapped strips of adhesive-backed foil.

It has been discovered that, when the width w of the adhesive-backed foil 12, 14 is less than the width W of the sheet 10 of dielectric material, the second surface 10ss of the sheet 10 can be covered only by use of multiple pieces of the adhesive-backed foil. It may not be effective to but-join the strips of adhesive-backed foil, because this may leave gaps, and those gaps may undesirably suffer deposition of a layer of coating similar to that which is intentionally applied to the first side 10fs of the sheet of dielectric material 10. This problem is solved by overlapping adjacent sheets 12a, 14a and 12b, 14b, as illustrated in FIG. 4, in an overlap region OR. It will be appreciated that, in principle, a longitudinal gap or tunnel could be manifested, running parallel to the overlapped joint, between the second surface 10ss of the substrate 10 and the adhesive layer 14a, and this region might also be subject to unwanted deposition of coating. It has been discovered that simply using substantial pressure in the overlap region is enough to avoid unwanted deposition problems.

Figure 5:
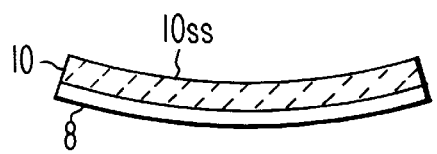
FIG. 5 illustrates the coated sheet dielectric substrate made according to the method of the invention.

FIG. 5 illustrates the sheet dielectric material 10 with the resulting coating 8. The thickness of the coating made by the described method has been found to be sufficient for optical filter use.

Figure 6A:
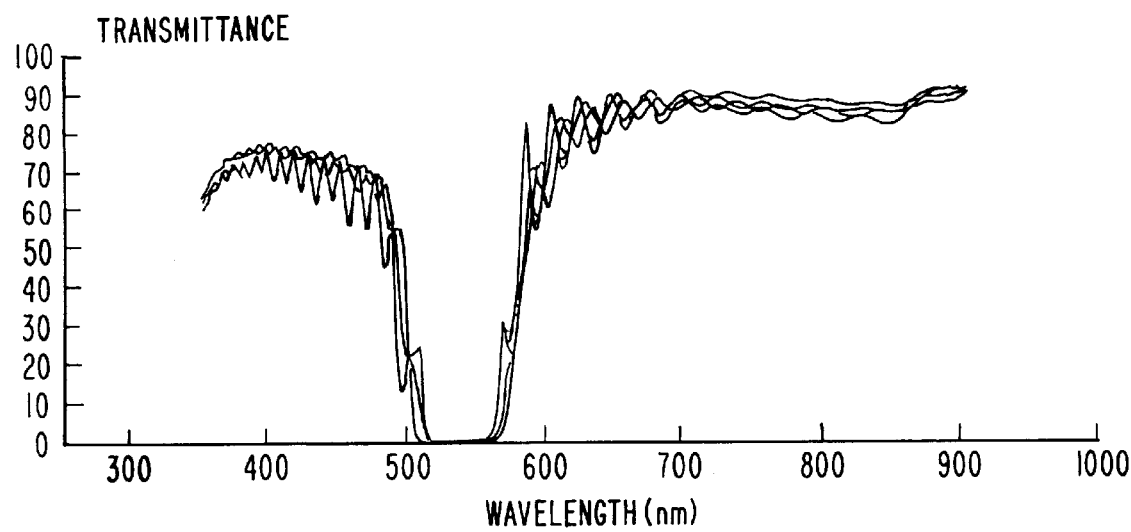
FIGS. 6a and 6b illustrate the response of rugate filters made according to the method of the invention and by another method.
Figure 6B:
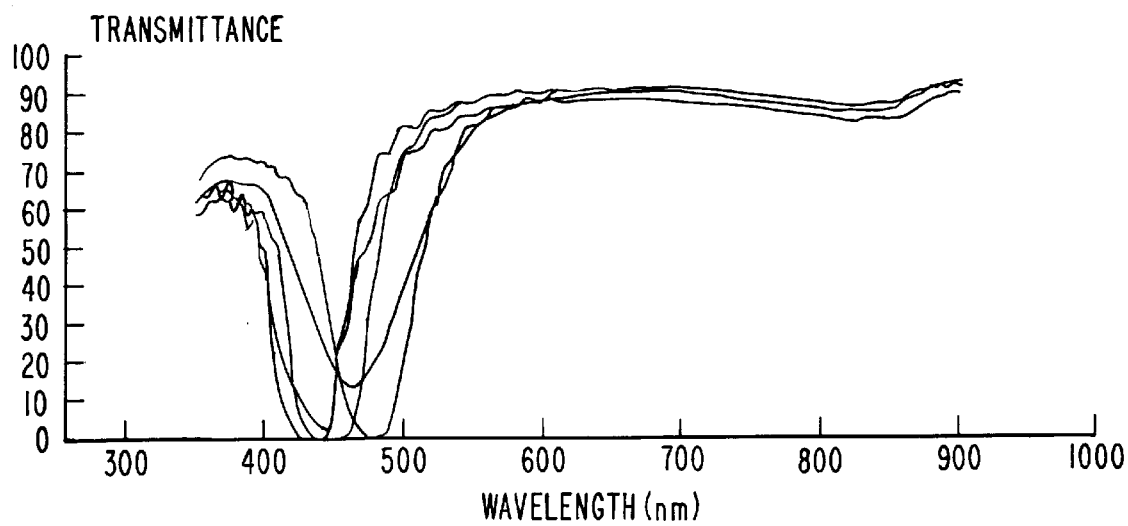

FIG. 6a illustrates plots of transmittance (amplitude) versus wavelength, or spectral response, for a rugate filter made on a watch glass by the method according to the invention, except that a flat "upper" electrode corresponding to electrode 16 was used, rather than a curved electrode. While the results are good using a flat electrode, the use of a curved electrode as illustrated and described in conjunction with FIG. 3 could be expected to provide improved results. The various plots of FIG. 6a were made at various different locations on the watch glass, so as to identify any locations at which the coating thickness was not uniform. As illustrated in the plots of FIG. 6a, the transmission spectra essentially overlap, thereby indicating uniform thickness of the filter coating at various locations. The plots of FIG. 6b were made at different locations on a watch glass coated by a different method. The watch glass coating of FIG. 6b was made with a flat upper and lower electrodes (the "upper" electrode being equivalent to electrode 16, and the "lower" electrode being equivalent to the foil electrode 12 of FIG. 3). The plots of FIG. 6b do not overlap very well, indicating that the thickness of the coating varies across its surface.

According to an aspect of the invention, the ratio of the precursor materials 30, 34 which are infused into the gap is changed over time, or in response to the thickness of that portion of the coating which is already deposited, in order to affect the index of refraction of the coating as a function of depth, in a manner which forms a rugate filter. This is accomplished, in the arrangement of FIG. 3, by adjusting the controls 28, 32 relative to each other, in a manner which decreases the concentration of one of the precursor components, and increases the other, with time. The adjustment may be step-wise or continuous over some range.

Other embodiments of the invention will be apparent to those skilled in the art. For example, while the preferred mode of the invention involves the use of adhesive-backed foil, it would be possible to practice the invention by applying adhesive to the second surface of the substrate, and then apply the foil to the adhesive. While deposition of a single layer has been described, the method according to the invention may be applied to the sequential deposition of multiple layers, one over the other, and the multiple layers may be of disparate materials, if desired. Transfer adhesives may be used, such as type Y966 produced by Minnesota Mining & Manufacturing Co. An electrically conductive adhesive material may be used, such as transfer adhesive type 9703, also manufactured by 3M, which has a thickness of about 0.001 inches. While a glass substrate has been described, it may be of other materials, and in particular may be of a transparent synthetic or polymeric material. The coating method can be applied to the making of coatings of (or on) materials other than optical.

Thus, a method, according to an aspect of the invention, for applying a coating (8) to a first surface (10fs) of a sheet dielectric substrate (10), includes the step of adhesively applying a layer of electrically conductive foil (12) to a second surface (10ss) of the sheet dielectric substrate (10). An electrode (16) is placed at a distance, which is preferably a constant distance (D) at all locations on the surfaces, from the first surface (10fs) of the sheet dielectric substrate (10), to thereby define a gap (18). At least the region (18r) lying between the electrode (16) and the first surface (10fs) of the sheet dielectric substrate (10) is evacuated. The evacuation can be performed by a pump (38) with the entire assemblage placed in a vacuum chamber (36). Coating precursor materials (30, 34) are infused into the gap (18), and then voltage (40) is applied (by conductors 42, 44) between the electrode (16) and the conductive foil (12), to thereby ionize the precursor materials into a plasma state. The coating (8) is, as a result, deposited the first surface (10fs) of the sheet dielectric material (10). In a particularly advantageous mode of performing the method of the invention, the step of adhesively applying includes the step of applying adhesive-backed foil (12, 14) to the second surface (10ss) of the sheet dielectric material (10). In those cases in which the width (w) of the adhesive-backed foil (12) is not as wide (W) as the second surface (10ss) of the sheet dielectric material, and the region about the second surface (10ss) of the substrate (10) is evacuated, the step of adhesively applying further includes the steps of placing overlapping strips of the adhesive-backed foil (12) on the second surface (10ss), and firmly pressing the adhesive-backed foil (12) strips to the second surface (10ss) of the sheet dielectric material (10), to thereby eliminate voids in the region (OR) of the overlap. The preferred method for infusing the gaseous coating precursor materials (30, 34) into the gap (18) is through perforations (20) in the electrode (16).

In a particularly advantageous manifestation of the method, rugate filters are deposited on a first surface (10fs) of transparent curved sheet dielectric substrate (10), such as curved windows or windshields, by adhesively applying a layer of electrically conductive foil (12) to a second surface (10ss) of the sheet dielectric substrate (10). An electrode (16) which is curved to match the curvature of the substrate (10) is placed at a constant distance (D) from the first surface (10fs) of the sheet dielectric substrate (10), to thereby define a gap (18). At least the region lying between the electrode (16) and the first surface (10fs) of the sheet dielectric substrate (10) is evacuated, and the entire sheet dielectric substrate (10) may be placed in an evacuated chamber. A least first and second gaseous coating precursor materials (30, 34) at a particular ratio are infused into the gap (18). Voltage (40) is applied between the electrode (16) and the conductive foil (12), to thereby ionize the precursor materials into a plasma state, whereby coating is deposited on the surface of the first side of the sheet dielectric material. The ratio of the precursor materials is changed as a function of at least one of time and the thickness of the coating.

What is claimed is:

1. A method for applying a coating to a first surface of a sheet dielectric substrate, said method comprising the steps of:

adhesively applying to a second surface of said sheet dielectric substrate a layer of electrically conductive foil;

placing an electrode at a distance from said first surface of said sheet dielectric substrate, to thereby define a gap;

evacuating at least the region lying between said electrode and said first surface of said sheet dielectric substrate;

infusing gaseous coating precursor materials into said gap; and applying voltage between said electrode and said conductive foil, to thereby ionize said precursor materials into a plasma state, whereby said coating is deposited on said first surface of said sheet dielectric material.

2. A method according to claim 1, wherein said step of adhesively applying includes the step of applying adhesive-backed foil to said second surface of said sheet dielectric material.

3. A method according to claim 2, wherein said step of adhesively applying further includes the step of:

placing overlapping strips of said adhesive-backed foil; and firmly pressing said adhesive-backed foil strips to said second surface of said sheet dielectric material, to thereby eliminate voids in the region of said overlap.

4. A method according to claim 1, wherein said step of infusing includes the step of infusing said gaseous coating precursor materials through perforations in said electrode.

5. A method according to claim 1, wherein said step of placing an electrode at a distance includes the step of placing an electrode at a constant distance.

6. A method for making a rugate filter on a first surface of a transparent curved sheet dielectric substrate, said method comprising the steps of:

adhesively applying a layer of electrically conductive foil to a second surface of said sheet dielectric substrate;

placing an electrode at a constant distance from said first surface of said sheet dielectric substrate, to thereby define a gap;

evacuating at least the region lying between said electrode and said first surface of said sheet dielectric substrate;

infusing at least first and second gaseous coating precursor materials at a particular ratio into said gap;

applying voltage between said electrode and said conductive foil, to thereby ionize said precursor materials into a plasma state, whereby said coating is deposited on said surface of said first side of said sheet dielectric material; and changing said ratio as a function of at least one of time and the thickness of said coating.

7. A method according to claim 6, wherein said step of adhesively applying includes the step of applying adhesive-backed foil to said second surface of said sheet dielectric material.

8. A method according to claim 7, wherein said step of adhesively applying further includes the step of:

placing overlapping strips of said adhesive-backed foil; and firmly pressing said adhesive-backed foil strips to said second surface of said sheet dielectric material, to thereby eliminate voids in the region of said overlap.

9. A method according to claim 6, wherein said step of infusing includes the step of infusing said gaseous coating precursor materials through perforations in said electrode.

10. A method according to claim 6, wherein said step of placing an electrode comprises the step of placing an electrode which is curved to match the curvature of said sheet dielectric substrate.

* * * * *